(12) United States Patent
Kim et al.

(10) Patent No.: US 9,312,518 B2
(45) Date of Patent: Apr. 12, 2016

(54) METHOD OF MANUFACTURING MASK SUBSTRATE AND METHOD OF MANUFACTURING ORGANIC ELECTROLUMINESCENT DISPLAY USING THE SAME

(71) Applicant: SAMSUNG DISPLAY CO., LTD., Yongin, Gyeonggi-Do (KR)

(72) Inventors: Hyo Yeon Kim, Yongin-si (KR); Ha-Jin Song, Yongin-si (KR); Sang-Woo Lee, Yongin-si (KR); Hye-Yeon Shim, Yongin-si (KR); Heun-Seung Lee, Yongin-si (KR); Kyul Han, Yongin-si (KR); Sang-Woo Pyo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/961,866

(22) Filed: Aug. 7, 2013

(65) Prior Publication Data
US 2014/0154825 A1      Jun. 5, 2014

(30) Foreign Application Priority Data

Dec. 3, 2012   (KR) ................. 10-2012-0139044

(51) Int. Cl.
  *H01L 51/56*   (2006.01)
  *H01L 27/32*   (2006.01)
  *H01L 51/00*   (2006.01)

(52) U.S. Cl.
  CPC ............ *H01L 51/56* (2013.01); *H01L 27/3241* (2013.01); *H01L 51/0011* (2013.01)

(58) Field of Classification Search
  CPC . H01L 51/56; H01L 51/5203; H01L 51/0011; H01L 51/44; H01L 51/52; H01L 51/5206; H01L 51/5221; H01L 51/5234; H01L 21/20; H01L 21/027; H01L 21/308; H01L 21/02351; H01L 21/0381; H01L 21/3083; H01L 21/0002
  USPC ........................................ 438/34; 257/40, 88
  See application file for complete search history.

(56) References Cited

U.S. PATENT DOCUMENTS

| | | | |
|---|---|---|---|
| 6,890,627 B2 * | 5/2005 | Culver et al. ............. | 428/195.1 |
| 2007/0080356 A1 * | 4/2007 | Nakayama et al. ............. | 257/88 |
| 2009/0160331 A1 * | 6/2009 | Omata et al. .................. | 313/506 |
| 2010/0291720 A1 * | 11/2010 | Kim et al. ........................ | 438/34 |
| 2011/0159201 A1 * | 6/2011 | Park et al. ..................... | 427/469 |
| 2012/0099615 A1 | 4/2012 | Sun et al. | |

FOREIGN PATENT DOCUMENTS

| | | | |
|---|---|---|---|
| KR | 2006013861 A | * | 2/2006 |
| KR | 10-2011-0046853 A | | 5/2011 |
| KR | 10-2011-0138787 A | | 12/2011 |
| KR | 10-2012-0042144 A | | 5/2012 |

* cited by examiner

*Primary Examiner* — Julia Slutsker
*Assistant Examiner* — Natalia Gondarenko
(74) *Attorney, Agent, or Firm* — Lewis Roca Rothgerber Christie LLP

(57) ABSTRACT

A first conductive member is positioned on a base substrate. A second conductive member is positioned on the first conductive member, the second conductive member being electrically coupled to the first conductive member, and having a resistivity higher than that of the first conductive member. A mask substrate is positioned on the second conductive member. A portion of the mask substrate that contacts the second conductive member is removed.

16 Claims, 10 Drawing Sheets

METHOD OF MANUFACTURING MASK SUBSTRATE AND METHOD OF MANUFACTURING ORGANIC ELECTROLUMINESCENT DISPLAY USING THE SAME

CROSS-REFERENCE TO RELATED APPLICATION

This application claims priority to and the benefit of Korean Patent Application No. 10-2012-0139044, filed in the Korean Intellectual Property Office on Dec. 3, 2012, the contents of which are hereby incorporated by reference.

BACKGROUND

1. Field

The present disclosure relates to a method of manufacturing a mask substrate and a method of manufacturing an organic electroluminescent display using the same.

2. Description of the Related Art

In recent years, an organic electroluminescent display has been spotlighted as a next generation display device because it has superior brightness and viewing angle when compared to a liquid crystal display device, and does not need to include a separate light source. Accordingly, the organic electroluminescent display has advantages of slimness and lightweight. In addition, the organic electroluminescent display typically has a relatively fast response speed, low driving voltage, and high brightness.

In general, the organic electroluminescent display includes an anode electrode, a cathode electrode, and an organic light emitting layer interposed between the anode electrode and the cathode electrode. Holes and electrons are injected into the organic emitting layer through the anode electrode and the cathode electrode, and are recombined in the organic light emitting layer to generate excitons (electron-hole pairs). The excitons emit energy, which is discharged when an excited state returns to a ground state, as light.

Meanwhile, elements except for the organic light emitting layer, e.g., the anode electrode and the cathode electrode, are easily manufactured using processes widely applied to manufacture liquid crystal display devices. However, forming the organic light emitting layer uses processes, which are not used to manufacture liquid crystal display devices. Accordingly, a production yield and a display quality of the organic electroluminescent display depend on the processes applied to form the organic light emitting layer.

SUMMARY

Embodiments according to the present disclosure provide a method of relatively easily manufacturing a mask substrate The present disclosure provides a method of easily manufacturing an organic electroluminescent display using the mask substrate.

Embodiments of the inventive concept provide a method of manufacturing a mask substrate provided as follows.

In one embodiment according to the present invention, a method of manufacturing a mask substrate includes: positioning a first conductive member on a base substrate; positioning a second conductive member on the first conductive member, the second conductive member being electrically coupled to the first conductive member, and having a resistivity higher than that of the first conductive member; positioning a mask substrate on the second conductive member; and removing a portion of the mask substrate that contacts the second conductive member.

The mask substrate may have a film shape.

The mask substrate may include a polymer material.

Removing the portion of the mask substrate may include transmitting a current to the second conductive member through the first conductive member to generate heat from the second conductive member The portion of the mask substrate that contacts the second conductive member may be burned and removed by the heat.

The heat may be a joule heat generated from the second conductive member by the current.

The first conductive member may include a plurality of first conductive members formed as adjacent lines extending across the base substrate, and the second conductive member may include a plurality of second conductive members arranged on the first conductive members.

The first conductive members may be spaced apart from each other and the second conductive members may be spaced apart from each other.

The method may further include removing the base substrate and the first and second conductive members from the mask substrate after removing the portion of the mask substrate.

In another embodiment according to the present invention, a method of manufacturing an organic electroluminescent display includes: positioning a first conductive member on a base substrate; positioning a second conductive member on the first conductive member, the second conductive member being electrically coupled to the first conductive member, and having a resistivity higher than that of the first conductive member; positioning a mask substrate on the second conductive member; removing a portion of the mask substrate that contacts the second conductive member to form a mask hole by transmitting a current to the second conductive member through the first conductive member to generate heat from the second conductive member; positioning an array substrate on the mask substrate; removing the base substrate and the first and second conductive members from the array substrate and the mask substrate to expose a portion of the array substrate through the mask hole; and forming an organic light emitting layer on the exposed portion of the array substrate.

The mask substrate may include a film shape.

The mask substrate may include a polymer material.

The portion of the mask substrate that contacts the second conductive member may be burned and removed by the heat.

The heat may be a joule heat generated from the second conductive member by the current.

The first conductive member may include a plurality of first conductive members formed as adjacent lines extending across the base substrate, and the second conductive member may include a plurality of second conductive members arranged on the first conductive members.

The first conductive members may be spaced apart from each other and the second conductive members may be spaced apart from each other.

The array substrate may include a plurality of pixel areas, and the pixel areas may be exposed through the removed portion of the mask substrate.

The array substrate may include a plurality of pixel areas, and the pixel areas may be exposed through the mask hole.

Forming of the organic light emitting layer on the exposed portion of the array substrate may include: depositing a preliminary organic light emitting layer on the mask substrate and the array substrate; and removing the mask substrate and a portion of the preliminary organic light emitting layer on the mask substrate from the array substrate to form the organic light emitting layer.

The method may further include: forming a common electrode on the organic light emitting layer after the organic light emitting layer is formed on the array substrate; and coupling a sealant substrate with the array substrate, wherein a pixel electrode is formed on the array substrate, and the pixel electrode of the array substrate is exposed through the mask hole prior to forming the organic light emitting layer on the array substrate.

According to the above, because the mask substrate is manufactured using the heat generated by the first and second conductive member, the area in which the mask hole is formed through the mask substrate may be relatively easily controlled by using the current applied to the first and second conductive members.

In addition, the mask substrate may be formed of the polymer material to have the film shape, and thus a weight of the mask substrate may be reduced. Accordingly, sagging of the mask substrate during the manufacturing process may be reduced or prevented.

Further, the mask substrate may be formed of the polymer material to have a film shape, and thus a manufacturing cost of the mask substrate may be reduced.

BRIEF DESCRIPTION OF THE DRAWINGS

The above and other aspects of embodiments of the present disclosure will become readily apparent by reference to the following detailed description when considered in conjunction with the accompanying drawings wherein.

DETAILED DESCRIPTION

Figure 1:
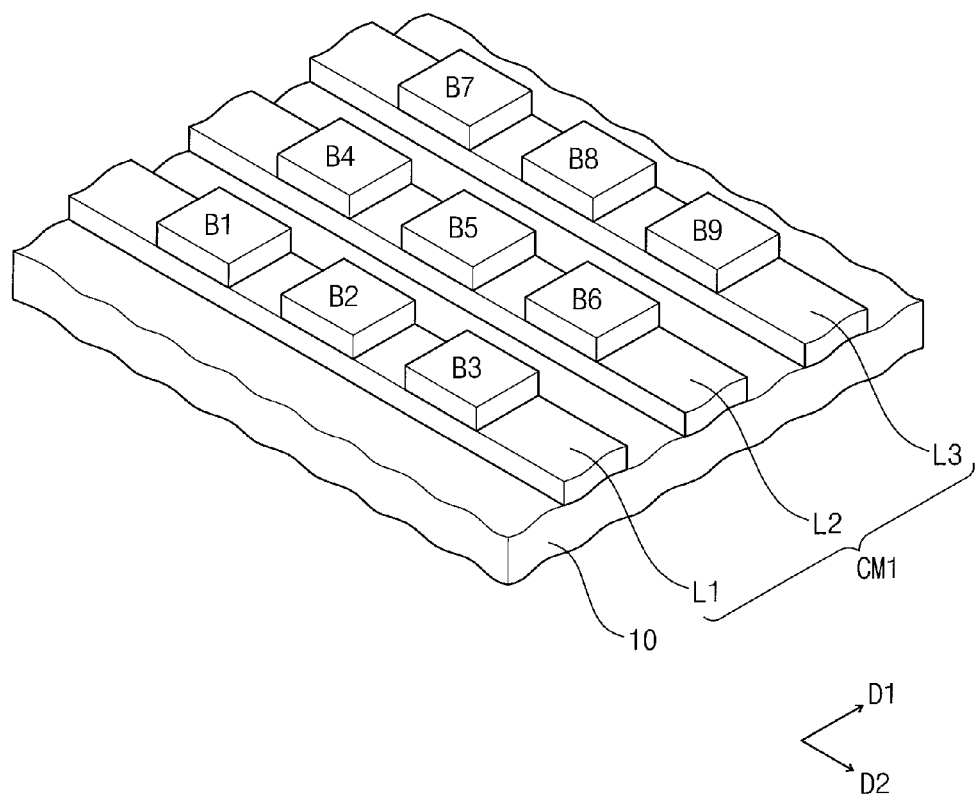
FIGS. 1, 2A, 2B, 3 are schematic views showing a method of manufacturing a mask substrate according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

FIGS. 1, 2A, 2B, and 3 are schematic views showing a method of manufacturing a mask substrate according to an exemplary embodiment of the present disclosure.

Referring to FIG. 1, a base substrate 10 is prepared. In the present exemplary embodiment, the base substrate 10 includes an insulating material, such as glass, and has a property in which an exterior of the base substrate 10 is not deformed by heat at a temperature of about one hundred degrees Celsius.

Then, a first conductive member CM1 is formed on the base substrate 10. In the present exemplary embodiment, the first conductive member CM1 includes a plurality of conductive lines. FIG. 1 shows a first conductive line L1, a second conductive line L2, and a third conductive line L3 among the conductive lines, and the other conductive lines will be omitted.

In the present exemplary embodiment, the first to third conductive lines L1, L2, and L3 are arranged adjacent to each other in a first direction D1 and spaced apart from each other, and the first to third conductive lines L1, L2, and L3 extend laterally across base substrate 10 in a second direction D2 that is substantially perpendicular to the first direction D1 and substantially parallel to a plane of the base substrate 10. In addition, each of the first to third conductive lines L1, L2, and L3 is formed of a metal with low resistivity, such as copper, gold, silver, and tungsten, or a carbon nanotube.

A method of forming the first to third conductive lines L1, L2, and L3 is determined depending on a size of each of the first to third conductive lines L1, L2, and L3. For example, in a case where a width of each of the first to third conductive lines L1, L2, and L3 approximately corresponds to a width of one pixel area (e.g., PA1 or PA2 of FIG. 4B) of an organic electroluminescent display, the first to third conductive lines L1, L2, and L3 may be formed by a chemical vapor deposition method and a sputtering method. Alternatively, in a case where the width of each of the first to third conductive lines L1, L2, and L3 approximately corresponds to a width of a display area including the entire pixel area of the organic electroluminescent display, the first to third conductive lines L1, L2, and L3 may be formed by positioning previously manufactured conductive bars on the base substrate 10.

In the present exemplary embodiment, wirings electrically coupled to the first to third conductive lines L1, L2, and L3 are provided. Thus, a current is applied to the first to third conductive lines L1, L2, and L3 through the wirings.

After the first to third conductive lines L1, L2, and L3 are formed on the base substrate 10, a second conductive member including a plurality of conductive layers is formed on the first to third conductive lines L1, L2, and L3. Among the conductive layers, first, second, third, fourth, fifth, sixth, seventh, eighth, and ninth conductive layers B1, B2, B3, B4, B5, B6, B7, B8, and B9 are shown in FIG. 1, and the other conductive layers are omitted.

The first to third conductive layers B1, B2, and B3 are arranged on the first conductive line L1 and are coupled to or directly contact the first conductive line L1. The first to third conductive layers B1, B2, and B3 are further arranged in the second direction D2 and are spaced apart from each other. The fourth to sixth conductive layers B4, B5, and B6 are arranged on the second conductive line L2 and are coupled to or directly contact the second conductive line L2. The fourth to sixth conductive layers B4, B5, and B6 are further arranged in the second direction D2 and are spaced apart from each other. The seventh to ninth conductive layers B7, B8, and B9 are arranged on the third conductive line L3 and are coupled to or directly contact the third conductive line L3. The seventh to ninth conductive layers B7, B8, and B9 are further arranged in the second direction D2 and are spaced apart from each other.

When each of the first to ninth conductive layers B1 to B9 is formed of a conductive material having a first resistivity and each of the first to third conductive lines L1, L2, and L3 is formed of a conductive material having a second resistivity, the first resistivity may be greater than the second resistivity. For example, when each of the first to third conductive lines L1, L2, and L3 is formed of copper, each of the first to ninth conductive layers B1 to B9 may be formed of nichrome having a greater resistivity than that of copper. For example, because the resistivity of copper is about $1.09 \times 10^{-6}$ Ω·m and the resistivity of nichrome is about $1.69 \times 10^{-8}$ Ω·m, the first resistivity is about a hundred times greater than the second resistivity. Thus, a temperature of joule heat generated by the first to ninth conductive layers B1 to B9 is higher than a temperature of joule heat generated by the first to third conductive lines L1, L2, and L3.

Figure 2A:
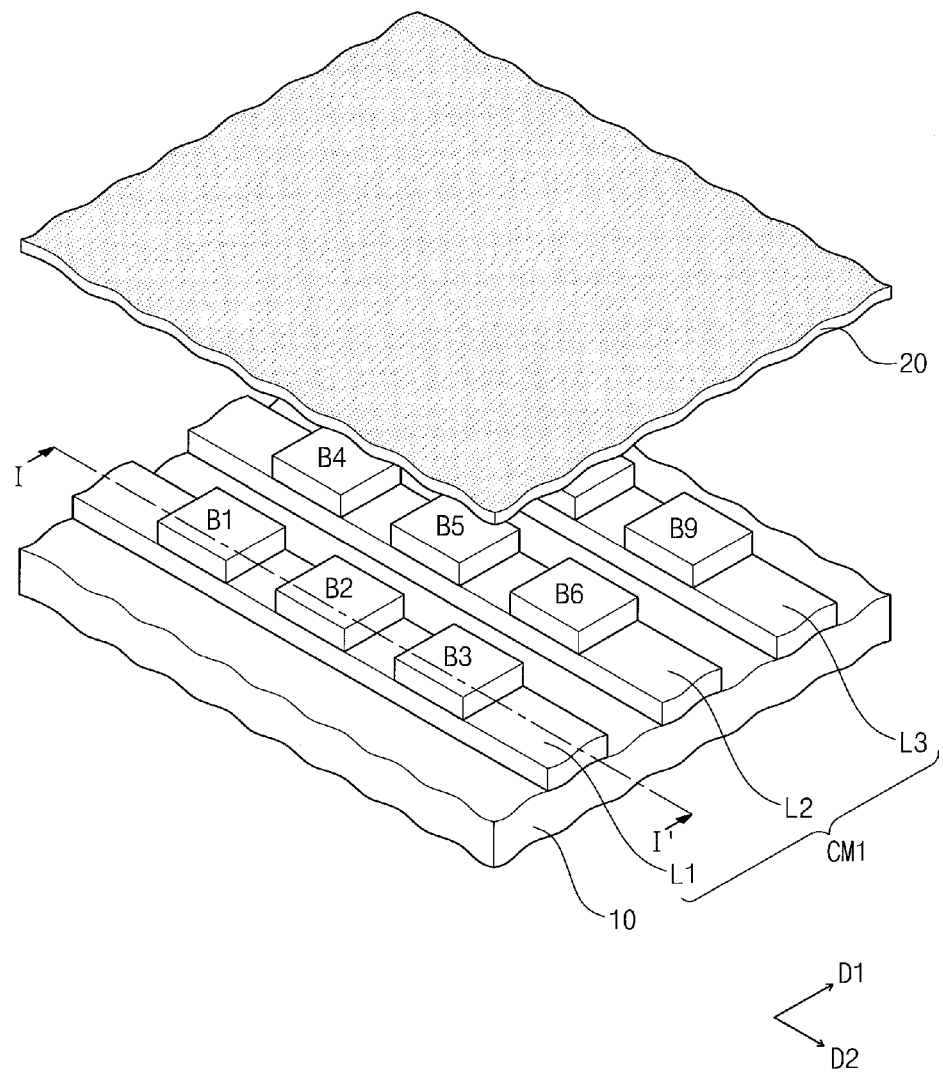
Figure 2B:
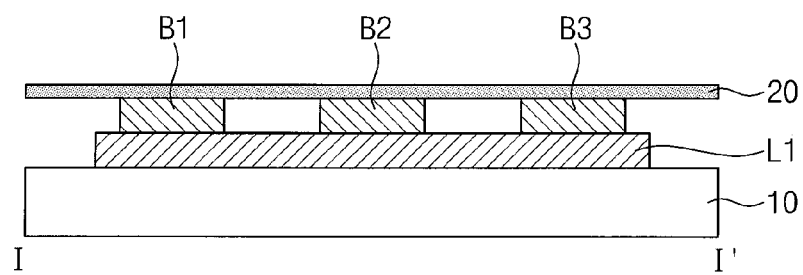

Referring to FIGS. 2A and 2B (FIG. 2B is a cross-sectional view taken along the line I-I' of FIG. 2A), a preliminary mask substrate 20 is positioned on the first to ninth conductive layers B1 to B9 and may contact the first to ninth conductive layers B1 to B9. In the present exemplary embodiment, the preliminary mask substrate 20 is formed in a shape (e.g., a film shape) having a thickness in a range of about 10 micrometers (μm) to about 100 μm. The preliminary mask substrate 20 is formed of a suitable polymer material, such as polymethylmethacrylate (PMMA), polycarbonate (PC), polystyrene (PS).

Figure 3:
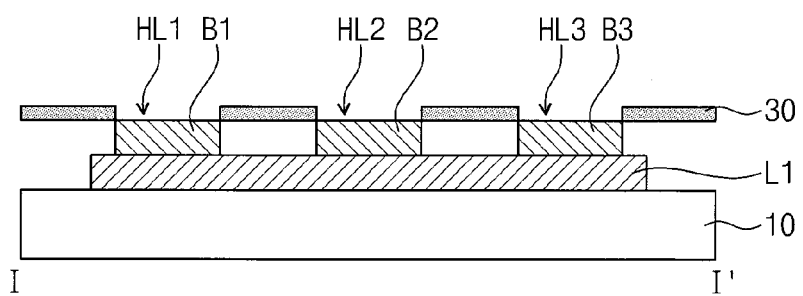

Referring to FIGS. 1 to 3, when a current is applied to the first to third conductive lines L1, L2, and L3, the current flows through the first to third conductive lines L1, L2, and L3, and the current concurrently (or simultaneously) flows through the first to ninth conductive layers B1 to B9, which make contact with one of the first to third conductive lines L1 to L3.

Meanwhile, as described above, when the resistivity of each of the first to ninth conductive layers B1 to B9 is greater than the resistivity of each of the first to third conductive lines L1, L2, and L3, it is relatively easy to ensure that the temperature of joule heat generated by the first to ninth conductive layers B1 to B9 is higher than the temperature of joule heat generated by the first to third conductive lines L1, L2, and L3 per unit time.

Therefore, when the intensity of the current is adjusted, a portion of the preliminary mask substrate 20 contacting the first to ninth conductive layers B1 to B9, is burned and removed by the joule heat generated in the first to ninth conductive layers B1 to B9, as shown in FIG. 3. As a result, the preliminary mask substrate 20 is patterned to allow a plurality of mask holes, for example, including a first mask hole HL1, a second mask hole HL2, and a third mask hole HL3, to be formed penetrating through the preliminary mask substrate 20 and exposing a surface of the first to ninth conductive layers B1 to B9 opposite the base substrate 10, and thus a mask substrate 30 is formed. In detail, the first mask hole HL1 is formed at a position corresponding to an area where the first conductive layer B1 makes contact with the preliminary mask substrate 20, the second mask hole HL2 is formed at a position corresponding to an area where the second conductive layer B2 makes contact with the preliminary mask substrate 20, and the third mask hole HL3 is formed at a position corresponding to an area where the third conductive layer B3 makes contact with the preliminary mask substrate 20.

Then, the base substrate 10, the first to third conductive lines L1, L2, and L3, and the first to ninth conductive layers B1 to B9 are removed from the mask substrate 30.

FIGS. 4A, 4B, 5, 6, 7, and 8 are schematic diagrams showing a method of manufacturing an organic electroluminescent display using the mask substrate shown in FIGS. 1 to 3. In FIGS. 4A, 4B, 5, 6, 7, and 8, the same reference numerals denote the same elements in FIGS. 1 to 3, and thus detailed descriptions of the same elements will be omitted.

Figure 4A:
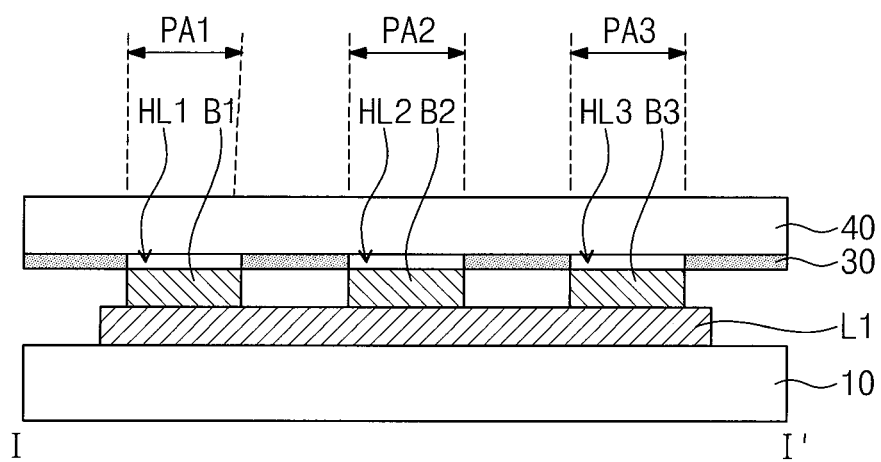
FIGS. 4A, 4B, 5, 6, 7, and 8 are schematic views showing a method of manufacturing an organic electroluminescent display using the mask substrate described with reference to FIGS. 1 to 3.
Figure 4B:
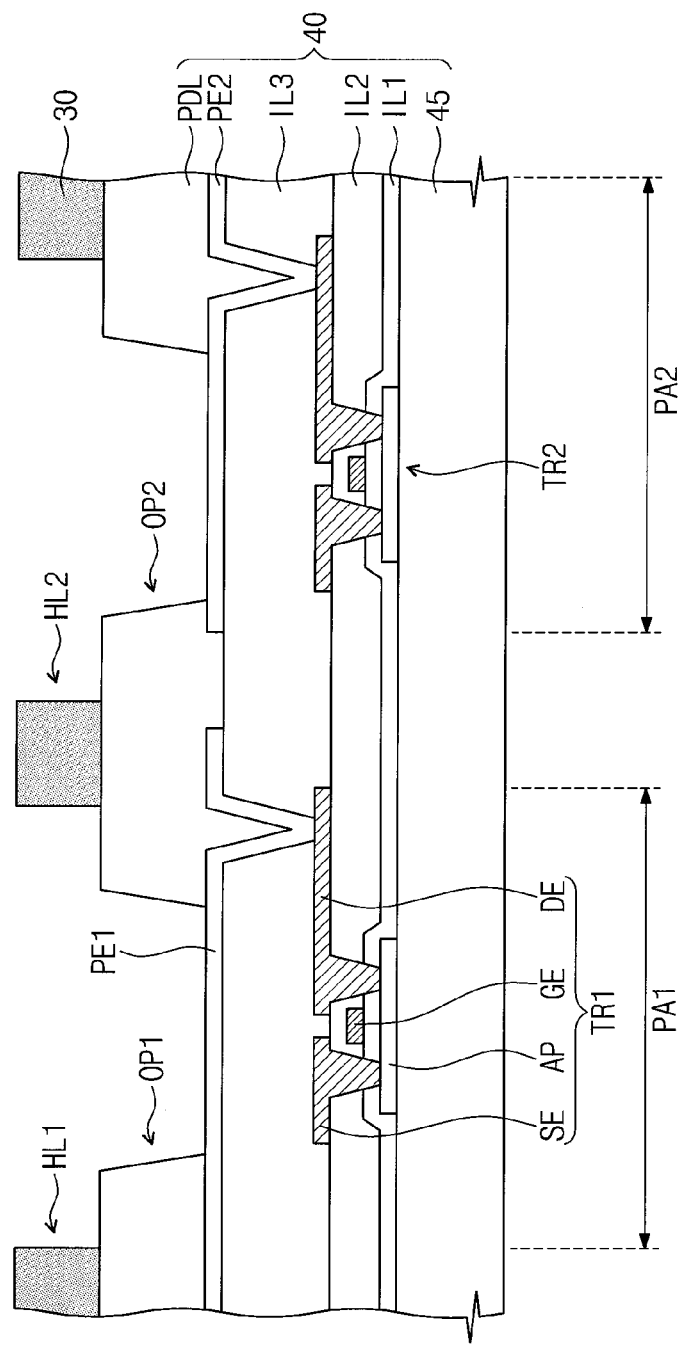

Referring to FIG. 4A and FIG. 4B (FIG. 4B is an enlarged view schematically showing a portion of FIG. 4A), an array substrate 40 is positioned on the mask substrate 30. The array substrate 40 includes a plurality of pixel areas, and hereinafter a structure of pixels arranged in first and second pixel areas PA1 and PA2 among the pixel areas will be described in detail.

As shown in FIG. 4B, the array substrate 40 includes an insulating substrate 45 having the first and second pixel areas PA1 and PA2, a first thin film transistor TR1, a second thin film transistor TR2, a first pixel electrode PE1, a second pixel electrode PE2, a gate insulating layer IL1, an inter-insulating layer IL2, a planarization layer IL3, and a pixel definition layer PDL.

The first and second thin film transistors TR1 and TR2 are formed (or located) on the insulating substrate 45. In the present exemplary embodiment, the first thin film transistor TR1 is electrically coupled to the first pixel electrode PE1 to switch a power signal provided to the first pixel electrode PE1. The second thin film transistor TR2 is electrically coupled to the second pixel electrode PE2 to switch a power signal provided to the second pixel electrode PE2.

A structure of the first thin film transistor TR1 will be described in detail as a representative example of the first and second thin film transistors TR1 and TR2. The first thin film transistor TR1 includes a gate electrode GE, an active pattern AP, a source electrode SE, and a drain electrode DE. The source electrode SE is electrically coupled to a power supply line (not shown) transmitting the power signal, and the drain electrode DE is electrically coupled to the first pixel electrode PE1. Thus, when the first thin film transistor TR1 is turned on, the power signal is applied to the first pixel electrode PE1 from the power line through the first thin film transistor TR1.

In the present exemplary embodiment, the active pattern AP includes a semiconductor material, and the semiconductor material includes amorphous silicon or crystalline silicon, but the semiconductor material should not be limited thereto or thereby. According to embodiment, the active pattern AP may include oxide semiconductor, such as $ZnO$, $SnO_2$, $In_2O_3$, $Zn_2SnO_4$, $Ge_2O_3$, and $HfO_2$, or the active pattern AP may include compound semiconductor, such as GsAs, GaP, and InP.

The gate insulating layer IL1 covers the active pattern AP to insulate the gate electrode GE and the active pattern AP from each other, and the inter-insulating layer IL2 covers the gate electrode GE to insulate the source and drain electrodes SE and DE from the gate electrode GE. The planarization layer IL3 has an insulating property and covers the first and second thin film transistors TR1 and TR2, and the planarization layer IL3 has a sufficient thickness to planarize an upper surface thereof.

The first and second pixel electrodes PE1 and PE2 are positioned on the planarization layer IL3. The first pixel electrode PE1 is electrically coupled to the drain electrode DE of the first thin film transistor TR1, and the second pixel electrode PE2 is electrically coupled to the drain electrode DE of the second thin film transistor TR2.

The pixel definition layer PDL is formed on the planarization layer IL3. The pixel definition layer PDL includes first and second openings OP1 and OP2 formed therethrough to correspond to the first and second pixel areas PA1 and PA2, respectively. An organic light emitting layer EL (shown in FIG. 7) is formed on the first and second pixel electrodes PE1 and PE2 through the first and second openings OP1 and OP2 in a later process.

Meanwhile, when the array substrate 40 is positioned on the mask substrate 30, the first to third mask holes HL1 to HL3 of the mask substrate 30 are arranged corresponding to the first to third pixel areas PA1 to PA3 of the array substrate 40 in a one-to-one correspondence. That is, the mask holes HL1 to HL3 are aligned with the first to third pixel areas PA1 to PA3.

Figure 5:
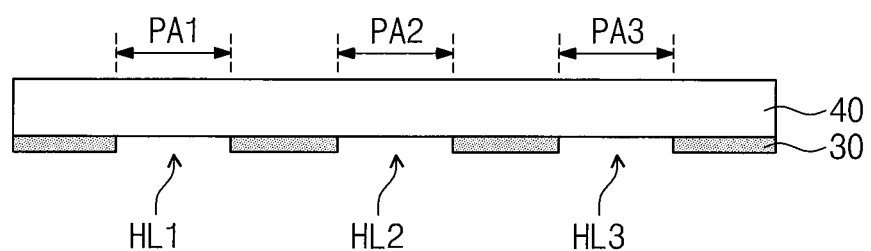

Referring to FIG. 5, the base substrate 10, the first to third conductive lines L1 to L3, and the first to ninth conductive layers B1 to B9 are removed from the array substrate 40 and the mask substrate 30. As a result, portions of the array substrate 40 are exposed to an exterior through the first to third mask holes HL1 to HL3 of the mask substrate 30. That is, portions of a surface of the array substrate 40 are respectively exposed through the first to third mask holes HL1 to HL3 of the mask substrate 30, while the mask substrate 30 maintains coverage over other portions of the surface of the array substrate 40.

For example, the first pixel electrode PE1 (e.g., shown in FIG. 4B) located in the first pixel area PA1 of the array substrate 40 is exposed to the exterior through the first mask hole HL1, the second pixel electrode PE2 (e.g., shown in FIG. 4B) located in the second pixel area PA2 of the array substrate 40 is exposed to the exterior through the second mask hole HL2, and another pixel electrode located in the third pixel area PA3 of the array substrate 40 is exposed to the exterior through the third mask hole HL3.

Figure 6:
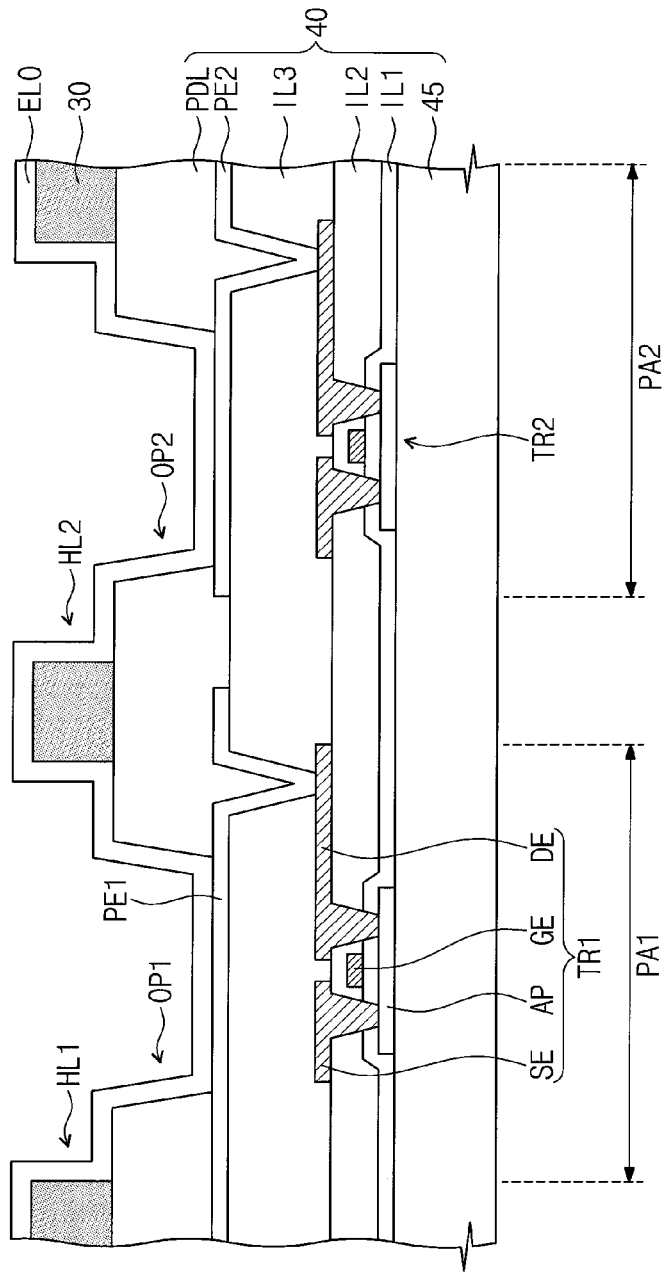
Figure 7:
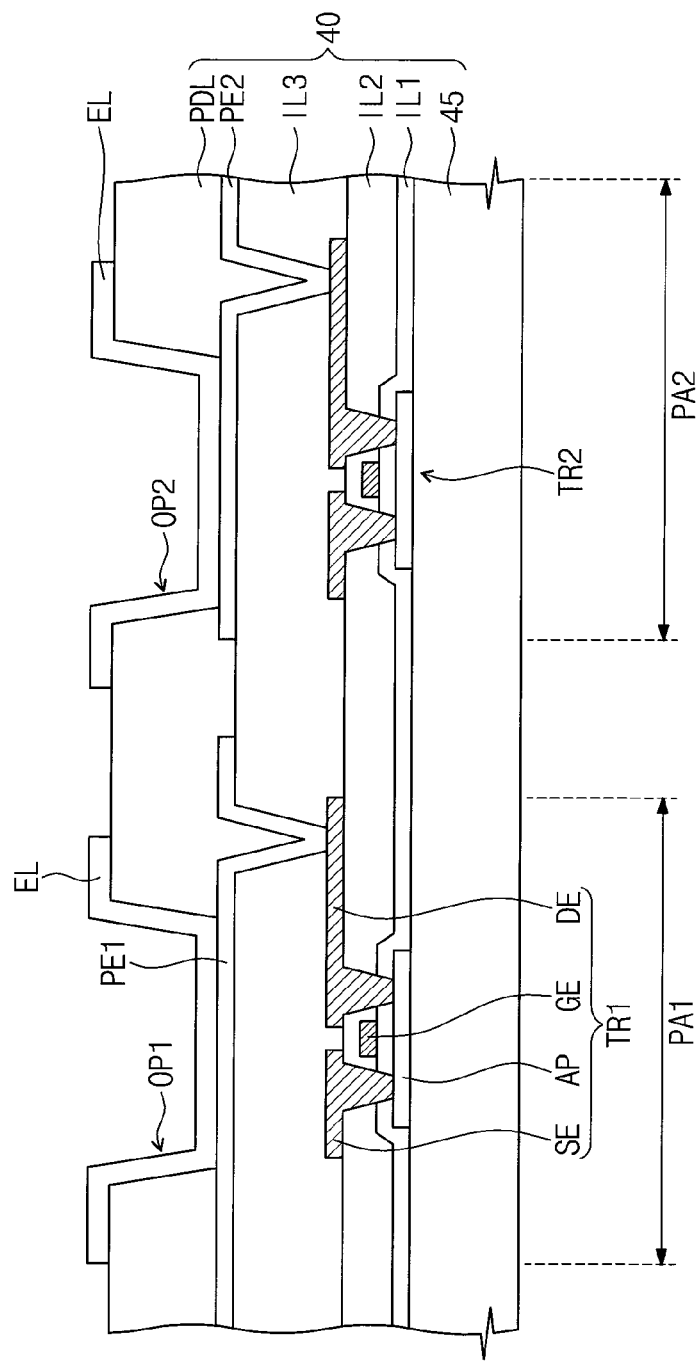

Referring to FIGS. 6 and 7, a preliminary organic light emitting layer EL0 is formed on the mask substrate 30 and the array substrate 40. In the present exemplary embodiment, the preliminary organic light emitting layer EL0 is formed by evaporating an organic material and depositing the evaporated organic material on the mask substrate 30 and the array substrate 40.

Then, the mask substrate 30 is removed from the array substrate 40, as shown in FIG. 7. As a result, a portion of the preliminary organic light emitting layer EL0 formed on the mask substrate 30 is removed along with the mask substrate 30, and the other portion of the preliminary organic light emitting layer EL0 remains in the first and second pixel areas PA1 and PA2. Therefore, the preliminary organic light emitting layer EL0 is patterned to form the organic light emitting layer EL, and the organic light emitting layer EL makes contact with the first pixel electrode PE1 and the second pixel electrode PE2 through the first opening OP1 and the second opening OP2, respectively.

Figure 8:
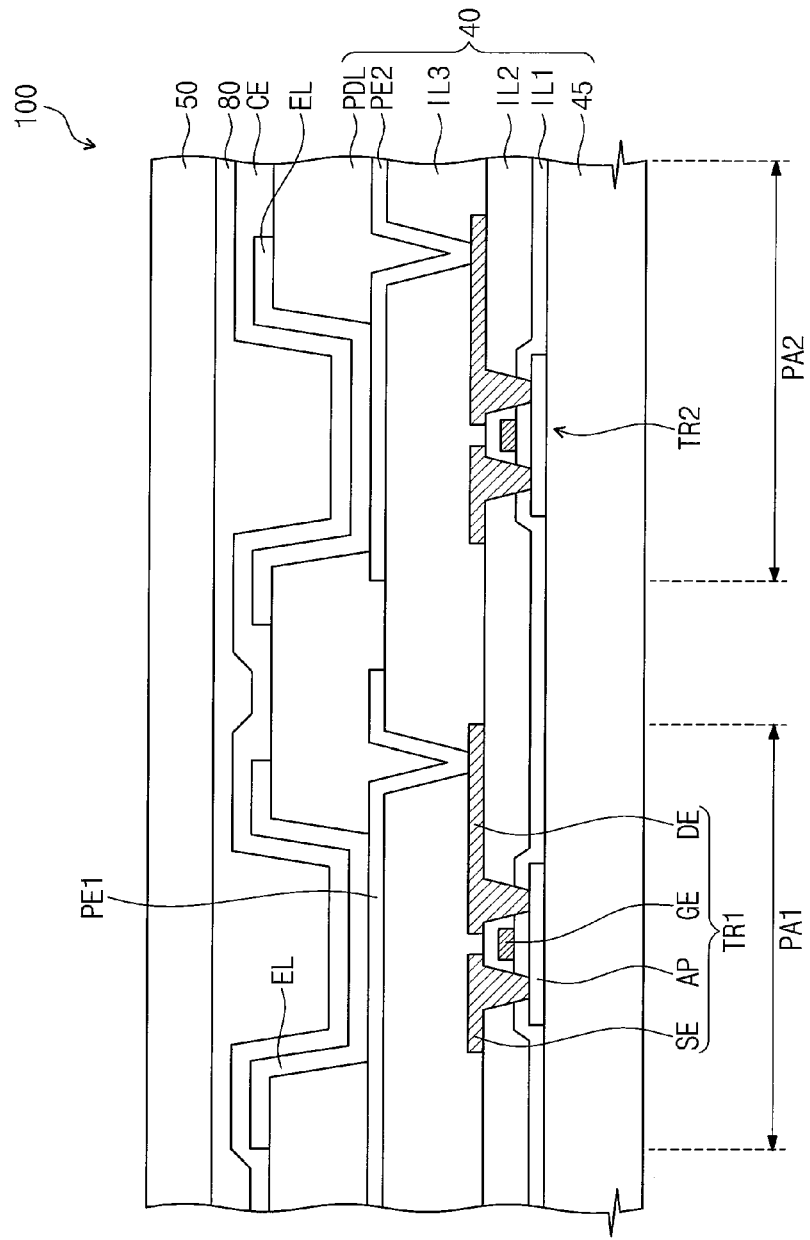

Referring to FIG. 8, a common electrode CE is formed on the organic light emitting layer EL. A sealant substrate 50 is formed over and coupled to the array substrate 40, with a filling layer 80 interposed between the sealant substrate 50 and the array substrate 40. As a result, the organic electroluminescent display is manufactured.

Figure 9:
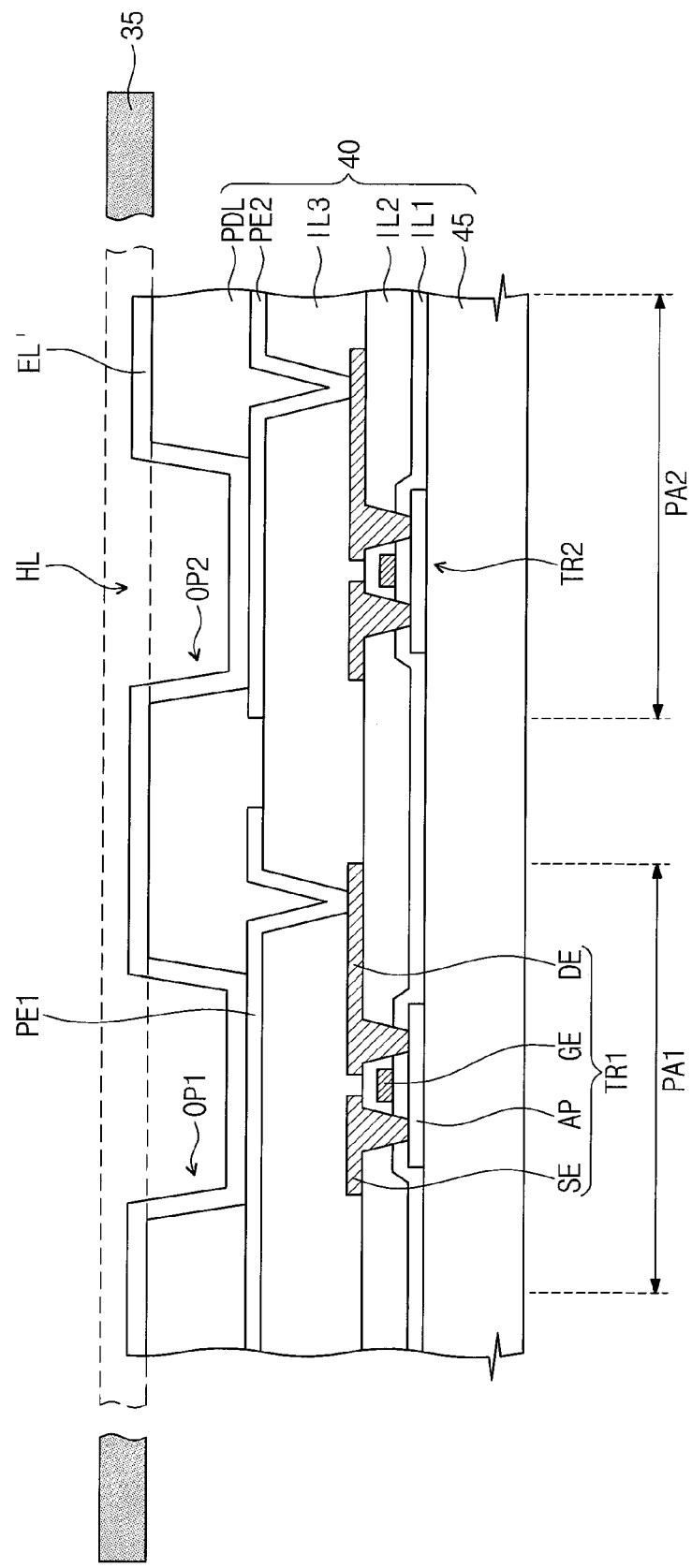
FIG. 9 is a schematic view showing a method of manufacturing an organic electroluminescent according to another exemplary embodiment of the present disclosure.

FIG. 9 is a schematic view showing a method of manufacturing an organic electroluminescent display according to another exemplary embodiment of the present disclosure.

Referring to FIG. 9, in the present exemplary embodiment, a mask substrate 35 is manufactured through substantially the same processes as the mask substrate 30 shown in FIGS. 1 to 3, however, a mask hole HL formed through the mask substrate 35 has a size larger than that of the first to third mask holes HL1 to HL3 shown in FIG. 3.

Thus, pixel areas including a first pixel area PA1 and a second pixel area PA2 of an array substrate 40 are both exposed to an exterior through the mask hole HL. The mask substrate 35 having the above-described structure is called an open mask. When the mask substrate 35 is used, an organic light emitting layer EL' having a single-layer structure is formed in the pixel areas.

In the present exemplary embodiment, the organic light emitting layer EL' emits a white light. Therefore, color filters are further formed in the pixel areas to convert the white light to a colored light in order to emit colored light from the pixel areas.

Although the exemplary embodiments of the present disclosure have been described, it is understood that the present disclosure should not be limited to these exemplary embodiments but various changes and modifications can be made by one ordinary skilled in the art within the spirit and scope of the present disclosure as defined by the following claims and their equivalents.

What is claimed is:

1. A method of manufacturing a mask substrate, comprising:
   positioning a first conductive member on a base substrate;
   positioning a second conductive member on the first conductive member, the second conductive member being electrically coupled to the first conductive member, and having a resistivity higher than that of the first conductive member;
   positioning a mask substrate on the second conductive member;
   burning a portion of the mask substrate that contacts the second conductive member to remove the portion of the mask substrate and form a mask hole; and removing the base substrate, the first conductive member, and the second conductive member from the mask substrate after burning the portion of the mask substrate, wherein the mask hole is configured to control the deposition of an organic material through the mask hole onto an array substrate, wherein the mask substrate is formed of a material different from the organic material that is deposited onto the array substrate, and wherein burning the portion of the mask substrate comprises transmitting a current to the second conductive member through the first conductive member to generate heat from the second conductive member.

2. The method of claim 1, wherein the mask substrate has a film shape.

3. The method of claim 2, wherein the mask substrate comprises a polymer material.

4. The method of claim 1, wherein the heat is a joule heat generated from the second conductive member by the current.

5. The method of claim 1, wherein the first conductive member comprises a plurality of first conductive members formed as adjacent lines extending across the base substrate, and the second conductive member comprises a plurality of second conductive members arranged on the first conductive members.

6. The method of claim 5, wherein the first conductive members are spaced apart from each other and the second conductive members are spaced apart from each other.

7. A method of manufacturing an organic electroluminescent display, comprising:

positioning a first conductive member on a base substrate;

positioning a second conductive member on the first conductive member, the second conductive member being electrically coupled to the first conductive member, and having a resistivity higher than that of the first conductive member;

positioning a mask substrate on the second conductive member;

burning a portion of the mask substrate that contacts the second conductive member to remove the portion of the mask substrate and form a mask hole by transmitting a current to the second conductive member through the first conductive member to generate heat from the second conductive member;

positioning an array substrate on the mask substrate;

removing the base substrate and the first and second conductive members from the array substrate and the mask substrate to expose a portion of the array substrate through the mask hole; and forming an organic light emitting layer on the exposed portion of the array substrate by depositing an organic material through the mask hole onto the array substrate, wherein the mask substrate is formed of a material different from the organic material that is deposited onto the array substrate.

8. The method of claim 7, wherein the mask substrate has a film shape.

9. The method of claim 8, wherein the mask substrate comprises a polymer material.

10. The method of claim 7, wherein the heat is a joule heat generated from the second conductive member by the current.

11. The method of claim 7, wherein the first conductive member comprises a plurality of first conductive members formed as adjacent lines extending across the base substrate, and the second conductive member comprises a plurality of second conductive members arranged on the first conductive members.

12. The method of claim 11, wherein the first conductive members are spaced apart from each other and the second conductive members are spaced apart from each other.

13. The method of claim 12, wherein the array substrate comprises a plurality of pixel areas, and the pixel areas are exposed through the removed portion of the mask substrate.

14. The method of claim 7, wherein the array substrate comprises a plurality of pixel areas, and the pixel areas are exposed through the mask hole.

15. The method of claim 7, wherein the forming of the organic light emitting layer on the exposed portion of the array substrate comprises:

depositing a preliminary organic light emitting layer on the mask substrate and the array substrate; and removing the mask substrate and a portion of the preliminary organic light emitting layer on the mask substrate from the array substrate to form the organic light emitting layer.

16. The method of claim 7, further comprising:

forming a common electrode on the organic light emitting layer after the organic light emitting layer is formed on the array substrate; and coupling a sealant substrate with the array substrate, wherein a pixel electrode is formed on the array substrate, and the pixel electrode of the array substrate is exposed through the mask hole prior to forming the organic light emitting layer on the array substrate.

* * * * *